(12) United States Patent
Li et al.

(10) Patent No.: US 8,189,642 B1
(45) Date of Patent: May 29, 2012

(54) VCSEL SEMICONDUCTOR DEVICE

(75) Inventors: Nein-Yi Li, Albuquerque, NM (US); Chuan Xie, San Jose, CA (US); Chun Lei, Los Gatos, CA (US); Richard F. Carson, Albuquerque, NM (US)

(73) Assignee: Emcore Corporation, Albuquerque, NM (US)

( * ) Notice: Subject to any disclaimer, the term of this patent is extended or adjusted under 35 U.S.C. 154(b) by 258 days.

(21) Appl. No.: 12/710,173

(22) Filed: Feb. 22, 2010

Related U.S. Application Data

(63) Continuation-in-part of application No. 11/835,834, filed on Aug. 8, 2007.

(51) Int. Cl.
  *H01S 5/00* (2006.01)
(52) U.S. Cl. .................. 372/50.124; 372/46.013
(58) Field of Classification Search ............ 372/46.013, 372/46.015, 50.124
  See application file for complete search history.

(56) References Cited

U.S. PATENT DOCUMENTS

| | | |
|---|---|---|
| 5,136,345 A | 8/1992 | Kasahara |
| 5,208,820 A | 5/1993 | Kurihara et al. |
| 5,237,581 A | 8/1993 | Asada et al. |
| 5,468,656 A | 11/1995 | Shieh et al. |
| 5,940,422 A | 8/1999 | Johnson |
| 5,963,576 A | 10/1999 | Claisse et al. |
| 6,061,485 A | 5/2000 | Jiang et al. |
| 6,084,900 A | 7/2000 | Claisse et al. |
| 6,185,241 B1 | 2/2001 | Sun |
| 6,320,893 B1 | 11/2001 | Ueki |
| 6,628,694 B2 | 9/2003 | Deng et al. |
| 6,658,040 B1 | 12/2003 | Hu et al. |
| 6,751,245 B1 | 6/2004 | Wasserbauer et al. |
| 6,774,448 B1 | 8/2004 | Lindemann et al. |
| 6,879,038 B2 | 4/2005 | Dean |
| 6,904,072 B2 | 6/2005 | Cox et al. |
| 6,990,128 B2 | 1/2006 | Koyama et al. |
| 7,408,967 B2 | 8/2008 | Collins et al. |
| 2003/0219921 A1 | 11/2003 | Biard et al. |
| 2004/0156410 A1 | 8/2004 | DeBrabander et al. |

(Continued)

FOREIGN PATENT DOCUMENTS
WO   WO0045483 A1   8/2000

OTHER PUBLICATIONS

Shi, J-W. et al., "Single-mode vertical-cavity surface-emitting laser with ring-shaped light-emitting aperture." Applied Physics Letters, vol. 87, 031109-1-031109-3. 2005. AIP, Melville, NY.

*Primary Examiner* — Armando Rodriguez

(57) ABSTRACT

A vertical surface emitting laser having a mesa structure formed with sloping side walls. A passivation layer including at least two sublayers at least partially covers the mesa structure. The at least two sublayers have differing stress components arranged to at least partially counter each other. By making the mesa structure with sloping side walls, the deposition of the passivation layer in such a way as to minimize the net stress of the passivation layer is facilitated. In addition, the mesa structure has a first stack of mirror layers comprising a semiconductor material doped with a first dopant and having first peripheral oxidized portions extending a first distance into said first stack, and a second stack of mirror layers comprising a semiconductor material doped with a second dopant and having second peripheral oxidized portions extending a second distance into said second stack, wherein the first distance is different from the second distance. By controlling the first distance and the second distance appropriately, the internal stress in the mesa structure can be reduced.

12 Claims, 11 Drawing Sheets

U.S. PATENT DOCUMENTS

| | | |
|---|---|---|
| 2004/0169287 A1 | 9/2004 | Honda |
| 2004/0184500 A1 | 9/2004 | Kuwata |
| 2004/0233963 A1 | 11/2004 | Hooper et al. |
| 2004/0264531 A1 | 12/2004 | Ryou et al. |
| 2005/0175050 A1 | 8/2005 | Deng et al. |
| 2005/0201436 A1 | 9/2005 | Collins |
| 2007/0217472 A1 | 9/2007 | Collins et al. |
| 2007/0242716 A1 | 10/2007 | Samal et al. |
| 2008/0054268 A1 | 3/2008 | Imamura |
| 2008/0067546 A1 | 3/2008 | Murata et al. |
| 2008/0151961 A1 | 6/2008 | Kim et al. |
| 2008/0317081 A1 | 12/2008 | Kushibe et al. |
| 2009/0097517 A1 | 4/2009 | Sakamoto et al. |

VCSEL SEMICONDUCTOR DEVICE

The present application is a continuation-in-part of U.S. patent application Ser. No. 11/835,834 filed Aug. 8, 2007.

BACKGROUND OF THE INVENTION

1. Field of the Invention

The present invention relates to vertical cavity surface emitting lasers (VCSELs), and more particularly to VCSELs with reduced mechanical stress to improve reliability and performance.

2. The Background Art

Vertical-cavity surface-emitting lasers (VCSELs) have become the laser technology of choice for transceivers used in Storage-Area Network (SAN) and Local Area Network (LAN) applications. A typical VCSEL configuration includes an active region between two mirrors disposed one over another on the surface of the substrate wafer. An insulating region between the mirrors forces the current to flow through a small aperture, and the device lases perpendicular to the wafer surface (i.e., the "vertical" part of VCSEL).

There are two major technology platforms for manufacturing VCSELs. The difference in these platforms is based on the different techniques of current confinement, either by ion-implantation or by selective oxidation. In the ion implantation technique, protons are implanted in the semiconductor structure so as to form a high resistance region, thereby confining the current flow to a defined region. In the selective oxidation technique, the peripheral region of a mesa structure is oxidized, thereby defining an aperture surrounded by a high resistance region.

More particularly, in the selective oxidation method, after depositing an AlGaAs layer on a lower portion of an upper reflector, which is to be a high-resistance region, the resultant structure is etched, resulting in individual VCSELs on a wafer. Next, the wafer is left in an oxidation atmosphere for a predetermined period of time, to allow diffusion of vapor into the peripheral portion of the AlGaAs layer. As a result, an oxide insulating layer is formed at the peripheral portion as the high-resistance region, which limits flow of current, thereby resulting in an aperture surrounded by the high-resistance region.

The oxidative diffusion rate in forming an aperture of a VCSEL is highly sensitive to the temperature of the furnace used in the oxidizing diffusion, oxidation time and the amount of oxygen supplied into the furnace. A variation in the diffusion rate is a serious problem in mass production that requires high repeatability, and in forming a particular size of the aperture.

The implanted VCSELs have been proven very reliable. However, the operating speed of the implanted VCSELs usually limits their use to applications requiring less than 2 Gb/sec operating speed. Oxide VCSELs provide many superior properties of VCSEL performance including higher speed (demonstrated greater than 23 Gb/sec) and higher efficiency.

A typical VCSEL configuration includes epitaxial layers forming the active region and the two mirrors. The formation of the active region and the two mirrors involves using layers having differing aluminum compositions, which oxidize from the edge in differing distances, creating non-homogeneous layers within the side walls of the structure. This introduces stresses into the semiconductor structure. Such stress can result in failure of VCSEL devices. It has been found that a particular cause of failure of oxide VCSELs is the stress caused by this oxidation process.

Further, after fabrication of a VCSEL, hermetic sealing is required to avoid degradation of the semiconductor material as a result of exposure to the atmosphere. Previously, this has been done by mounting the VCSEL in a hermetic package, such as a TO can, or by applying a passivation layer over the surface of the semiconductor structure. U.S. Patent Application 2009/0041074, the whole contents of which are hereby incorporated by reference, discusses covering an epitaxial stack of a VCSEL with a passivation layer including a plurality of sublayers, at least some of which may be of different materials. At least two of the sublayers have opposing stresses and are disposed to reduce a net stress of the passivation layer in order to increase the mean time before the VCSEL fails.

As discussed in US 2007/0217472, the whole contents of which are hereby incorporated by reference, the electromagnetic wave propagation design of current commercially available 10 Gb/s VCSEL is single mode in the longitudinal or growth direction (z-axis) and multi-mode in the transverse or perpendicular to the growth direction (r-plane). Along the z-axis, the active semiconductor layer thicknesses are designed so that only a single optical mode couples to the laser gain peak. In the r-plane, the allowed transverse modes are determined by the size of the oxide aperture. Another factor determining the allowed transverse modes is that there is a gradual drop in the average refractive index of the layer of approximately 5% in a radial direction from the center of the mesa due the oxide aperture. This change in refractive index leads to index guiding of the transverse modes.

US 2007/0217472 proposes introducing a recessed portion or divot through the center of one of the two mirror stacks. In this way, optical modes which have a power density which is concentrated in the center of the mesa (e.g. the transverse optical modes P11, P13 and P31) are suppressed, resulting in an improvement of the spectral width characteristic of the VCSEL.

SUMMARY OF THE INVENTION

The present invention provides a method and structure for fabricating a VCSEL with reduced mechanical stress. In one aspect, the present invention provides a vertical cavity surface emitting laser having a mesa structure formed with sloping side walls. A passivation layer including at least two sublayers at least partially covers the mesa structure. The at least two sublayers have differing stress components arranged to at least partially counter each other. By making the mesa structure with sloping side walls, the deposition of the passivation layer in such a way as to minimize the net stress of the passivation layer is facilitated, and the need for planarization layers to facilitate electrical connection to the top of the etched mesa structure is eliminated.

In another aspect, the present invention provides a vertical cavity surface emitting laser having a mesa structure covered at least partly by a passivation layer. The passivation layer includes at least two sublayers having differing stress components arranged to at least partially counter each other. In addition, the mesa structure has a first stack of mirror layers comprising a semiconductor material doped with a first dopant and having first peripheral oxidized portions extending a first distance into said first stack, and a second stack of mirror layers comprising a semiconductor material doped with a second dopant and having second peripheral oxidized portions extending a second distance into said second stack, wherein the first distance is different from the second distance. By controlling the first distance and the second distance appropriately, the internal stress in the mesa structure can be reduced.

In a further aspect, the present invention also provides a method of manufacturing a vertical cavity surface emitting laser including forming an epitaxial semiconductor structure on a substrate, the epitaxial semiconductor structure having a cavity region between a first stack of mirror layers and a second stack of mirror layers; etching a pattern into the epitaxial semiconductor structure to form a mesa structure; and exposing the mesa structure to an oxidation atmosphere, whereby first oxidized portions are formed in a peripheral portion of the first stack of mirror layers and second oxidized portions are formed in a peripheral portion of the second stack of mirror layers. The first oxidized portions have a first lateral extent arranged to introduce a first internal stress component to counter a second internal stress component associated with the doped semiconductor material in said first stack, and the second oxidized portions have a second lateral extent arranged to introduce a third internal stress component to counter a fourth internal stress component associated with the doped semiconductor material in said second stack.

Some implementations of the present invention may incorporate or implement fewer of the aspects and features noted in the foregoing summaries.

DESCRIPTION OF THE PREFERRED EMBODIMENT

Figure 1A:
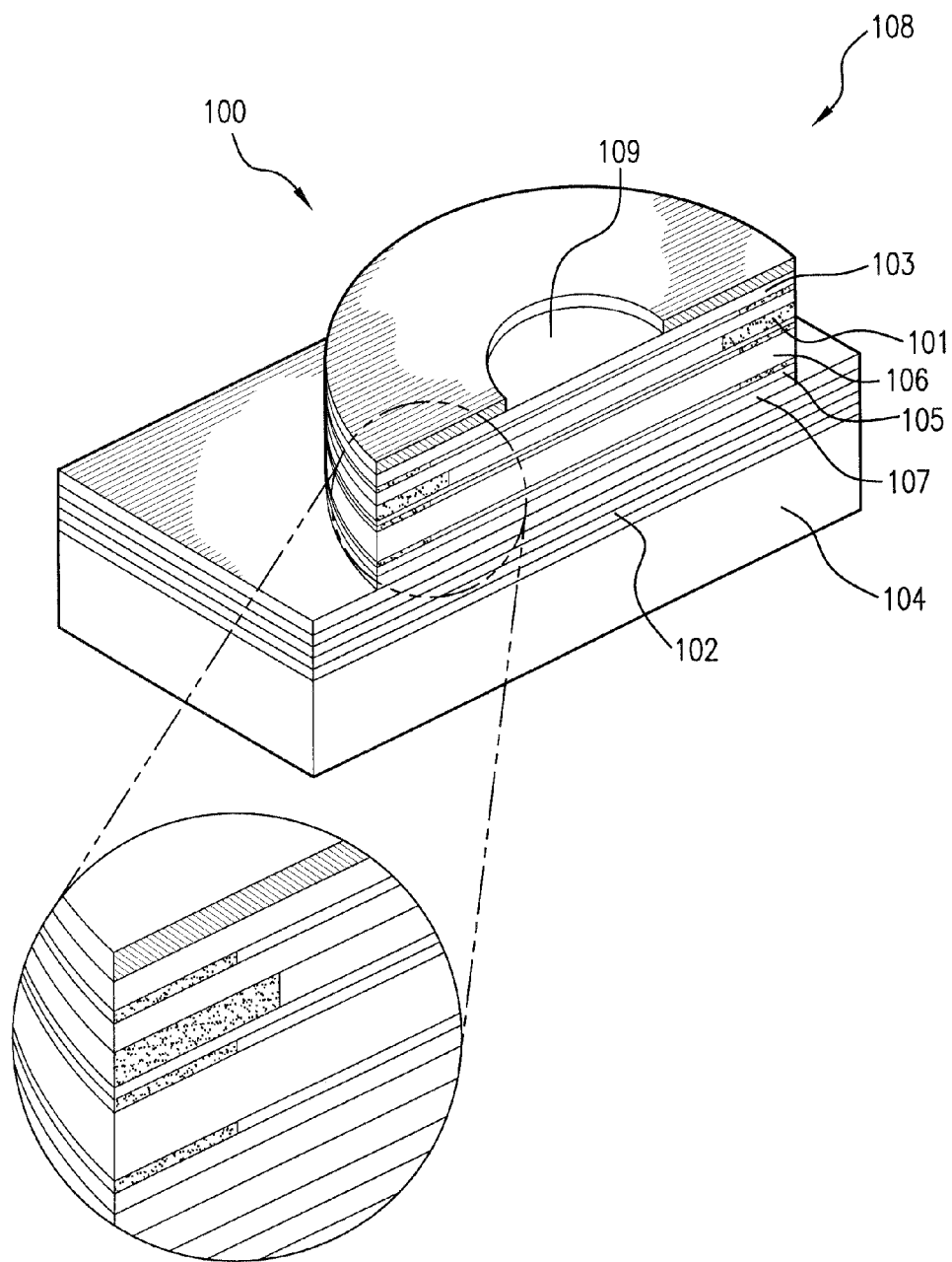
FIG. 1A shows in perspective a schematic cross-sectional view of the semiconductor structure for a mesa type oxide-confined VCSEL as is known in the prior art.

Details of the present invention will now be described, including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of actual embodiments nor the relative dimensions of the depicted elements, and are not drawn to scale.

Referring to FIG. 1A there is shown a fragmentary, cross-sectional view of a semiconductor structure of an oxide confined VCSEL as is known in the prior art. In particular, the VCSEL 100 includes a laser cavity region 105 that is defined between a first semiconductor region 102 that forms a first mirror stack and a second semiconductor region 103 that forms a second mirror stack. The semiconductor regions 102 and 103 are disposed on a substrate 104. The cavity region 105 includes one or more active layers (e.g., a quantum well or one or more quantum dots). The active layers may be sandwiched between a pair of spacer layers 106, 107. Electrical contacts (not shown in FIG. 1A) are provided to the structure to enable a suitable driving circuit to be applied to the VCSEL 100.

In the illustrative representation of FIG. 1, first and second mirror stacks 102, 103, are designed so that the laser light is emitted from the top surface of VCSEL 100; in other embodiments, the mirror stacks may be designed so that laser light is emitted from the bottom surface of substrate 104.

In operation, an operating voltage is applied to the electrical contacts to produce a current flow in the semiconductor structure. The current flows through a central region of the semiconductor structure resulting in lasing in a central portion of cavity region 105. A confinement region defined by a surrounding oxide region 101 or ion implanted region, or both, provides lateral confinement of carriers and photons. The relatively high electrical resistivity of the confinement region causes electrical current to be directed to and flow through a centrally located region of the semiconductor structure. Further, in the oxide VCSEL, optical confinement of photons generated in the cavity region 105 results from a substantial reduction in the refractive index profile in the oxidized regions. The carrier and optical lateral confinement increases the density of carriers and photons within the active region and increases the efficiency with which light is generated within the active region.

In some embodiments, the confinement region 101 circumscribes a central region of the VCSEL 100, which defines an aperture through which VCSEL current preferably flows. In other embodiments, oxide layers may be used as part of the distributed Bragg reflectors in the VCSEL structure.

The first and second mirror stacks 102 and 103 respectively each includes a system of alternating layers of different refractive index materials that forms a distributed Bragg reflector (DBR). The materials are chosen depending upon the desired operating laser wavelength (e.g., a wavelength in the range of 650 nm to 1650 nm). For example, first and second mirror stacks 102, 103 may be formed of alternating layers of high aluminum content AlGaAs and low aluminum content AlGaAs. The layers of first and second mirror stacks 102, 103, preferably have an effective optical thickness (i.e., the layer thickness multiplied by the refractive index of the layer) that is about one-quarter of the operating laser wavelength.

Figure 1B:
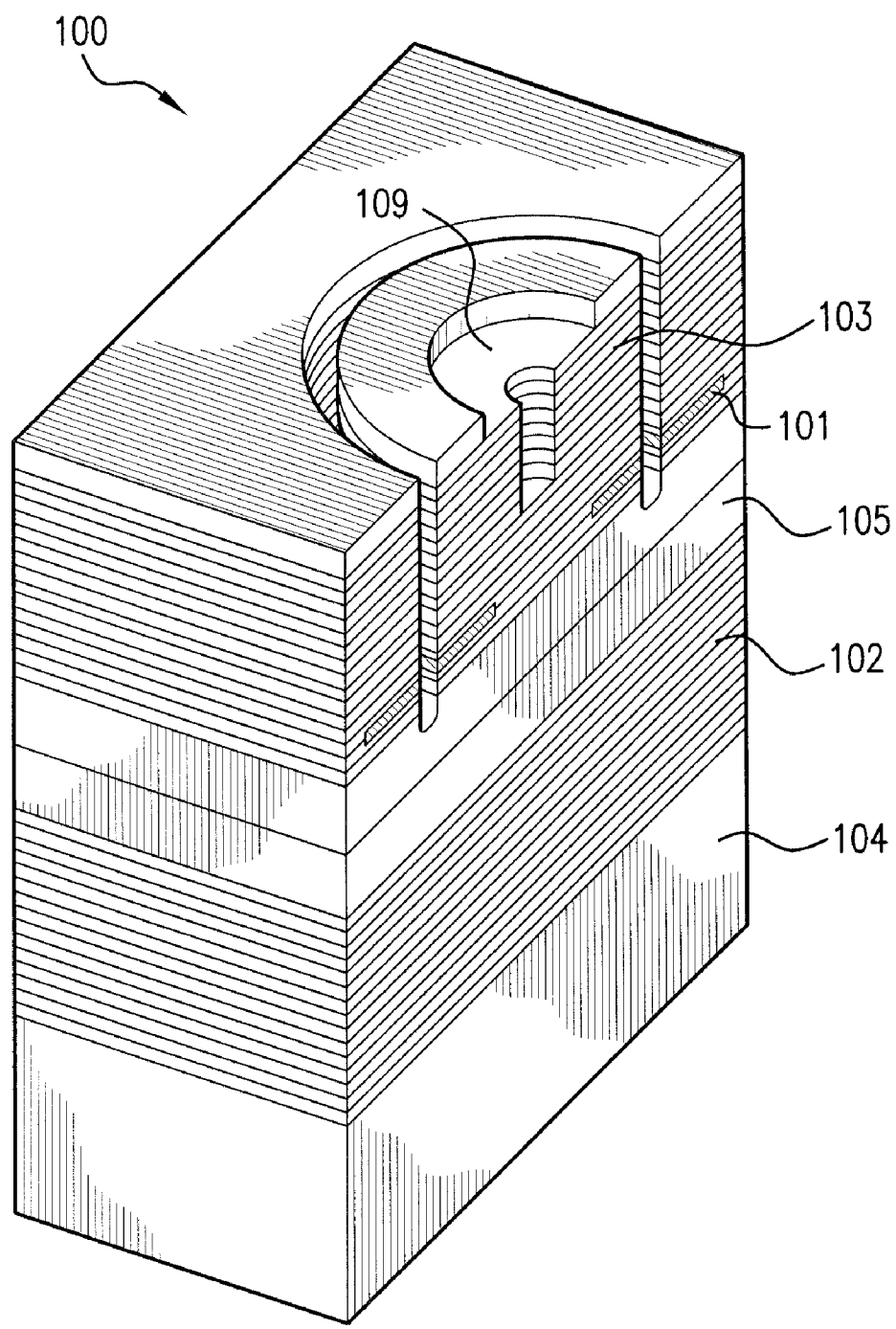
FIG. 1B shows in perspective a schematic cross-sectional view of a semiconductor structure for a trench type oxide-confined VCSEL as known in the prior art.

FIG. 1B illustrates a perspective view of another VCSEL 100 as is known in the prior art, such as represented in published U.S. Patent Application 2003/0219921, or U.S. Pat. No. 6,628,694, which includes an insulating region that can be formed by partial oxidation of a thin, high aluminum-content layer within the structure of an associated VCSEL mirror. FIG. 1B represents a schematic cross-sectional view of an oxide-isolated VCSEL 100 surrounded by a trench, as opposed to the mesa type structure 108 shown in FIG. 1A. As indicated in FIG. 1B, VCSEL 100 generally includes an emission aperture 109, an oxide or ion implanted confinement region 101 forming an aperture, and cavity region 105.

The fabrication of a VCSEL 200 according to an embodiment of the invention will now be described with reference to FIGS. 2 to 5.

Figure 2:
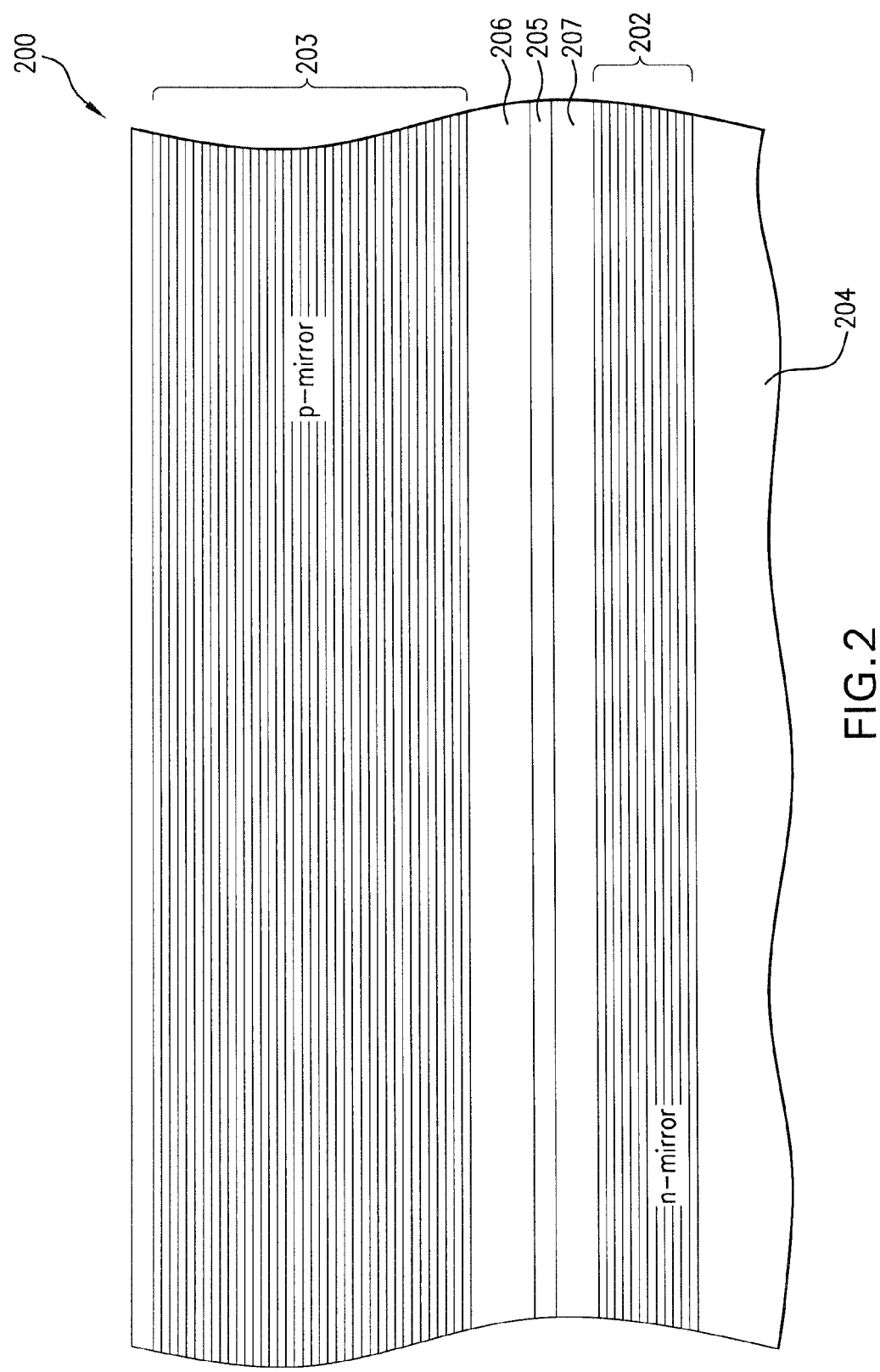
FIG. 2 schematically shows cross-sectional view of a semiconductor structure in the form of an epitaxial stack in accordance with a first fabrication stage of a VCSEL according to an embodiment of the invention.
Figure 3:
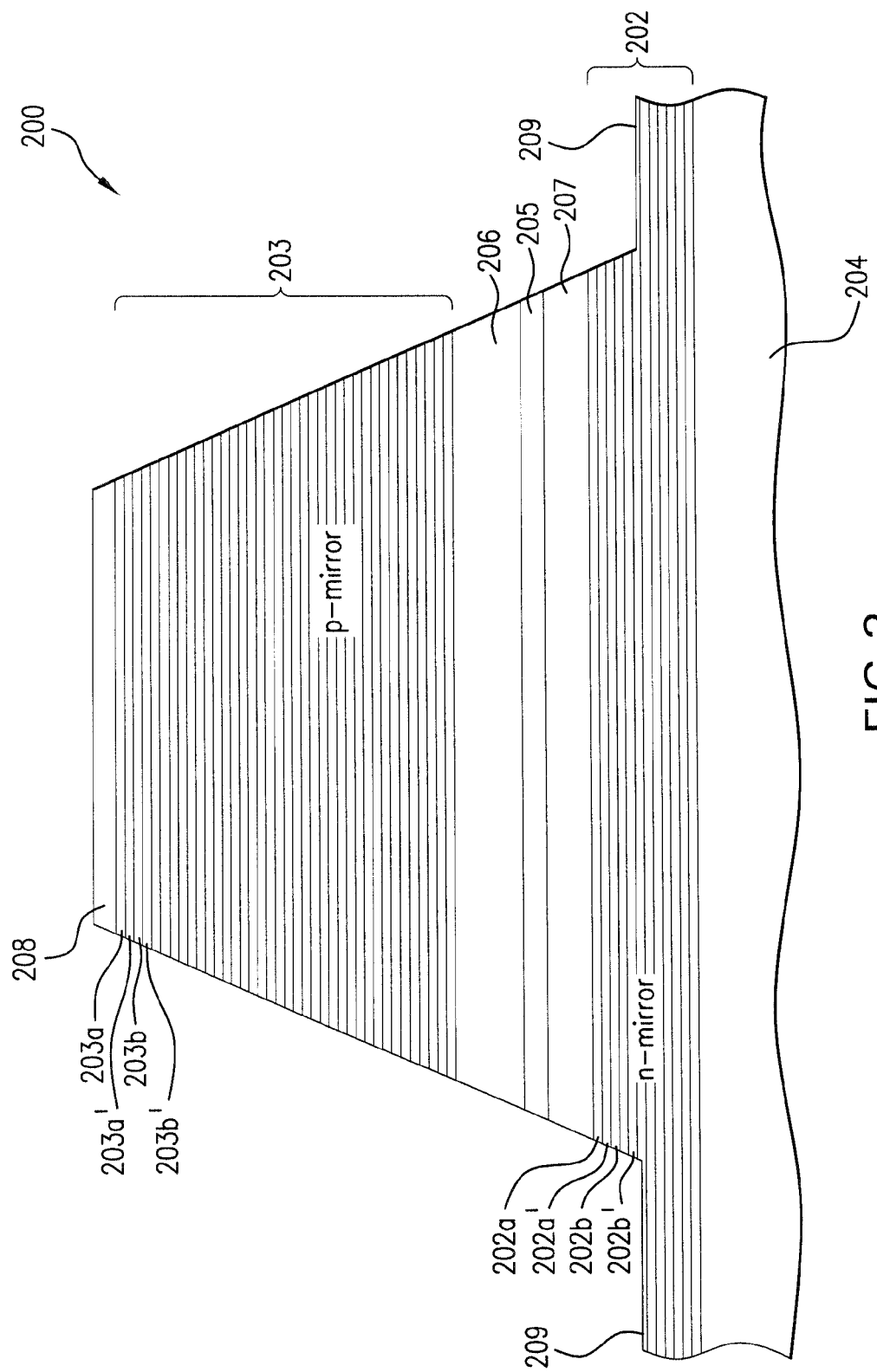
FIG. 3 schematically shows a cross-sectional view of the semiconductor structure illustrated in FIG. 2 following etching to form a mesa-structure in accordance with a second fabrication stage of a VCSEL according to an embodiment of the invention.

As shown in FIG. 2, an epitaxial semiconductor structure including a first mirror stack 202, an active region 205 and a second mirror stack 203 are formed on a substrate 204 by conventional epitaxial growth processes, such as metal-organic chemical vapor deposition (MOCVD) or molecular beam epitaxy (MBE). The substrate 204 may be formed from GaAs, InP, sapphire ($Al_2O_3$), or InGaAs and may be undoped, doped n-type (e.g., with Si) or doped p-typed (e.g., with Zn). A buffer layer may be grown on substrate 204 before VCSEL 200 is formed.

The active region 205 may be formed from AlInGaAs (i.e. AlInGaAs, GaAs, AlGaAs and InGaAs), InGaAsP (i.e., InGaAsP, GaAs, InGaAs, GaAsP, and GaP), GaAsSb (i.e. GaAsSb, GaAs, and GaSb), InGaAsN (i.e. InGaAsN, GaAs, InGaAs, GaAsN, and GaN), or AlInGAAsP (i.e., AlInGaAsP, AlInGaAs, AlGaAs, InGaAs, InGaAsP, GaAs, InGaAs, GaAsP, and GaP). Other quantum well layer compositions also may be used. In this embodiment, the active region 205 is sandwiched between a pair of spacer layers 206, 207 which may be composed of aluminum, gallium and arsenide depending upon the material composition of the active layers.

Each of the first and second mirror stacks 202 and 203 includes a respective system of alternating layers of different refractive index materials that forms a distributed Bragg reflector (DBR). The materials are chosen depending upon the desired operating laser wavelength (e.g., a wavelength in the range of 650 nm to 1650 nm). In this embodiment, first and second mirror stacks 202, 203 are formed of alternating layers of high aluminum content AlGaAs and low aluminum content AlGaAs. Further, in this embodiment the first mirror stack 202 is doped n-type and the second mirror stack 203 is doped p-type.

Following deposition of the first mirror stack 202, the active region 205 and the second mirror stack 203, the epitaxial semiconductor structure is patterned to form one or more individual VCSELs. In particular, the upper surface of second mirror stack 203 is provided with a layer of photoresist material according to any of the well known methods in the art. The photoresist layer is exposed and material is removed to define the position, shape and size of a mesa 208. The mesa 208 is then formed by etching the second mirror stack 203 by any suitable means known in the art, such as dry or wet etch processes. Typical dry etch processes use chlorine, nitrogen, and helium ions, and wet etch processes use sulpheric or phosphide acid etches.

Figure 4:
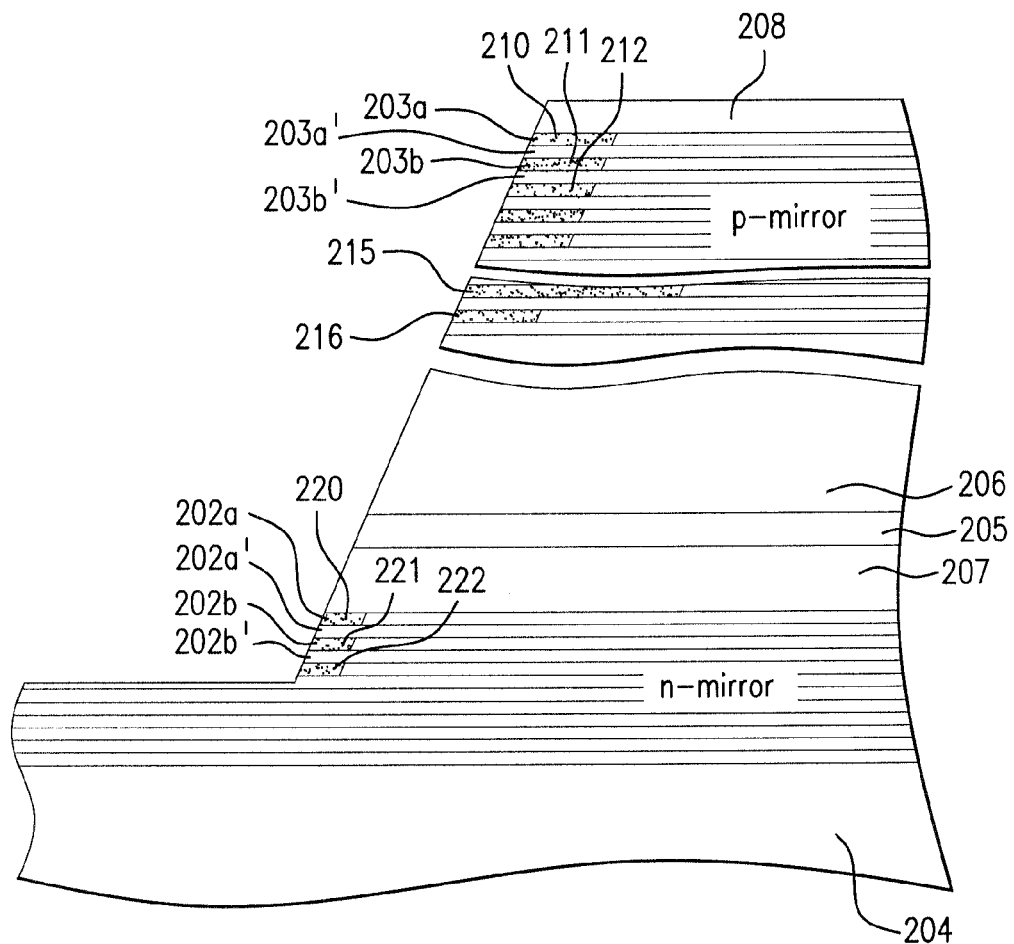
FIG. 4 schematically shows a cross-sectional detailed view of the semiconductor structure illustrated in FIG. 3 following exposure to an oxidation atmosphere in accordance with a third fabrication stage of a VCSEL according to an embodiment of the invention.

As shown in FIG. 4, in this embodiment the mesa 208 is formed with sloping side walls, and extends from partway through the first mirror stack 202. In an embodiment, the mesa 208 extends from approximately one fifth of the way through the first mirror stack 202. The sloped side walls may be at an angle from ten to thirty degrees from the direction perpendicular to the plane of the substrate (the vertical direction).

Following the etching of the mesa 208, the semiconductor structure is exposed to an oxidation atmosphere so that the periphery of the side walls of the mesa structure is oxidized. It is known that the lateral extent to which oxidation occurs in a layer is a function of the aluminum content of that layer, see for example U.S. Pat. No. 5,262,360. Accordingly, the lateral extent of the oxidation in a layer can be controlled by varying the aluminum content in that layer. In this embodiment, the high aluminum content AlGaAs layers 202a, 202b of the first mirror stack 202 have a lower aluminum content than the high aluminum content AlGaAs layers 203a, 203b of the second mirror stack 203. As the rate of oxidation varies with aluminum content, as shown in FIG. 4 this results in the lateral extent of the oxidized portions 210, 211, 212, 216 of the high aluminum content AlGaAs layers 203a, 203b of the second mirror stack 203 being greater than the lateral extent of the oxidized portions 220, 221, 222 of the high aluminum content AlGaAs layers 202a, 202b of the first mirror stack 202. In particular, the difference in lateral extent is at least 0.5 microns.

Preferably, the aluminum content of the high aluminum content AlGaAs layers 202a, 202b of the first mirror stack 202 and the high aluminum content AlGaAs layers 203a, 203b of the second mirror stack 203 is selected to reduce, and ideally to balance out, mechanical stress within the mesa 208 following oxidation. Given the different material compositions of the first mirror stack 202 and the second mirror stack 203, this results in this embodiment with the aluminum content in the high aluminum content AlGaAs layers of the first mirror stack 202 being at least 2%, and up to 10%, less than the aluminum content of the high aluminum content AlGaAs layers of the second mirror stack 203.

Also as shown in FIG. 4, in a conventional manner one layer of the epitaxial stack is formed with a particularly high aluminum content so that the oxidized portion 215 for that layer extends significantly further into the mesa 208 than for any other layer. The insulating properties of this oxidized portion 215 result in carrier confinement, thereby improving device performance. In this embodiment, the oxidized portion 215 defining the carrier confinement aperture is within the second mirror stack 203, although it will be appreciated that this is not essential.

Following oxidation, ohmic contacts 211, 212 are respectively provided to the p-type semiconductor material of the second mirror stack 203 and the n-type semiconductor material of the first mirror stack 202. Further, to prevent degradation of the semiconductor structure, a passivation layer is applied to the surface of the semiconductor structure. In this embodiment, the passivation layer is deposited over the entire surface of VCSEL 200, and then an opening is etched through on the upper surface of mesa 208 to generally coincide with and define a light emitting area.

Figure 5A:
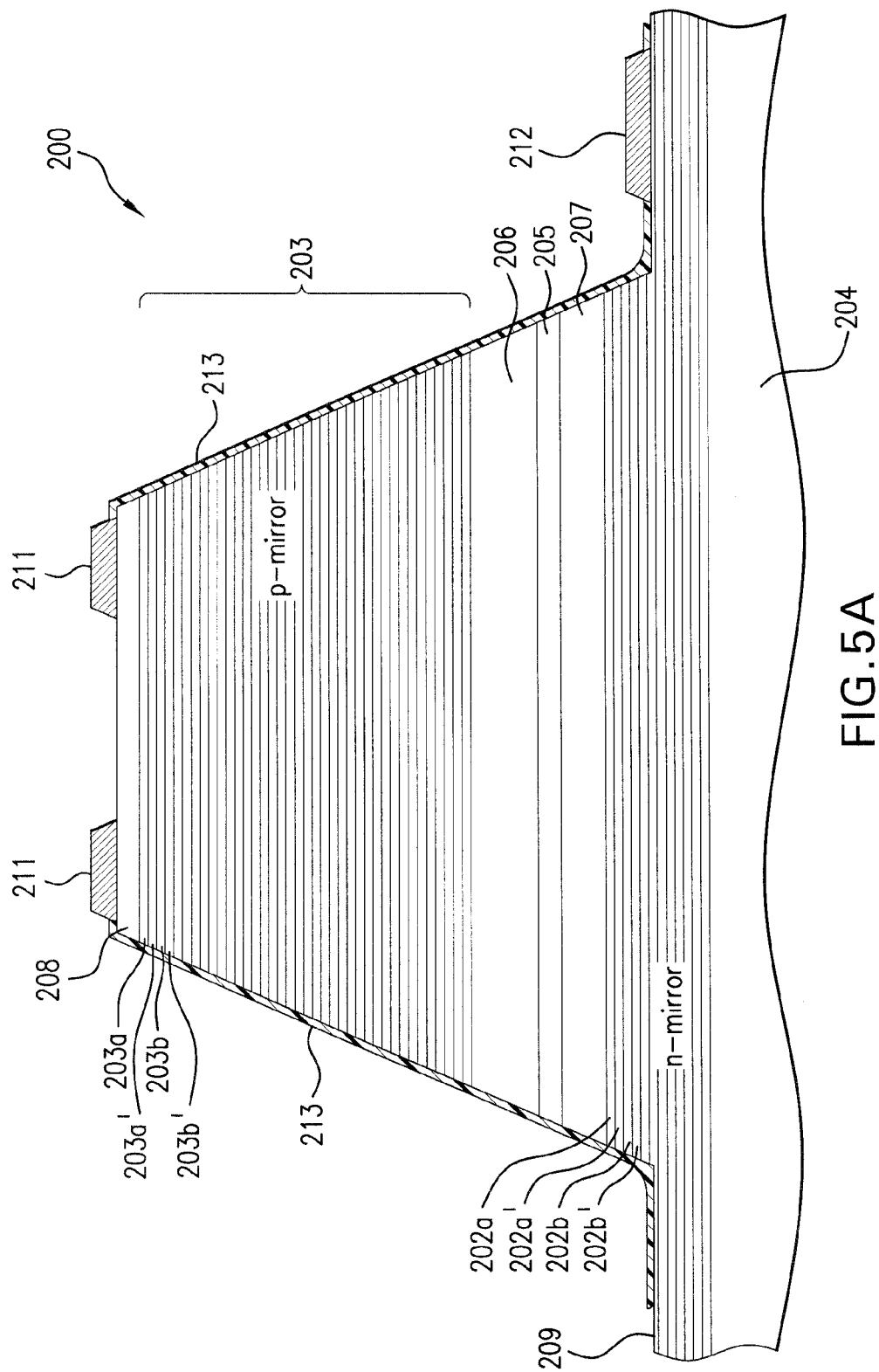
FIGS. 5A to 5C schematically show cross-sectional views through the semiconductor structure illustrated in FIG. 4 after a process to deposit n and p ohmic contacts and respective passivation layers.
Figure 5B:
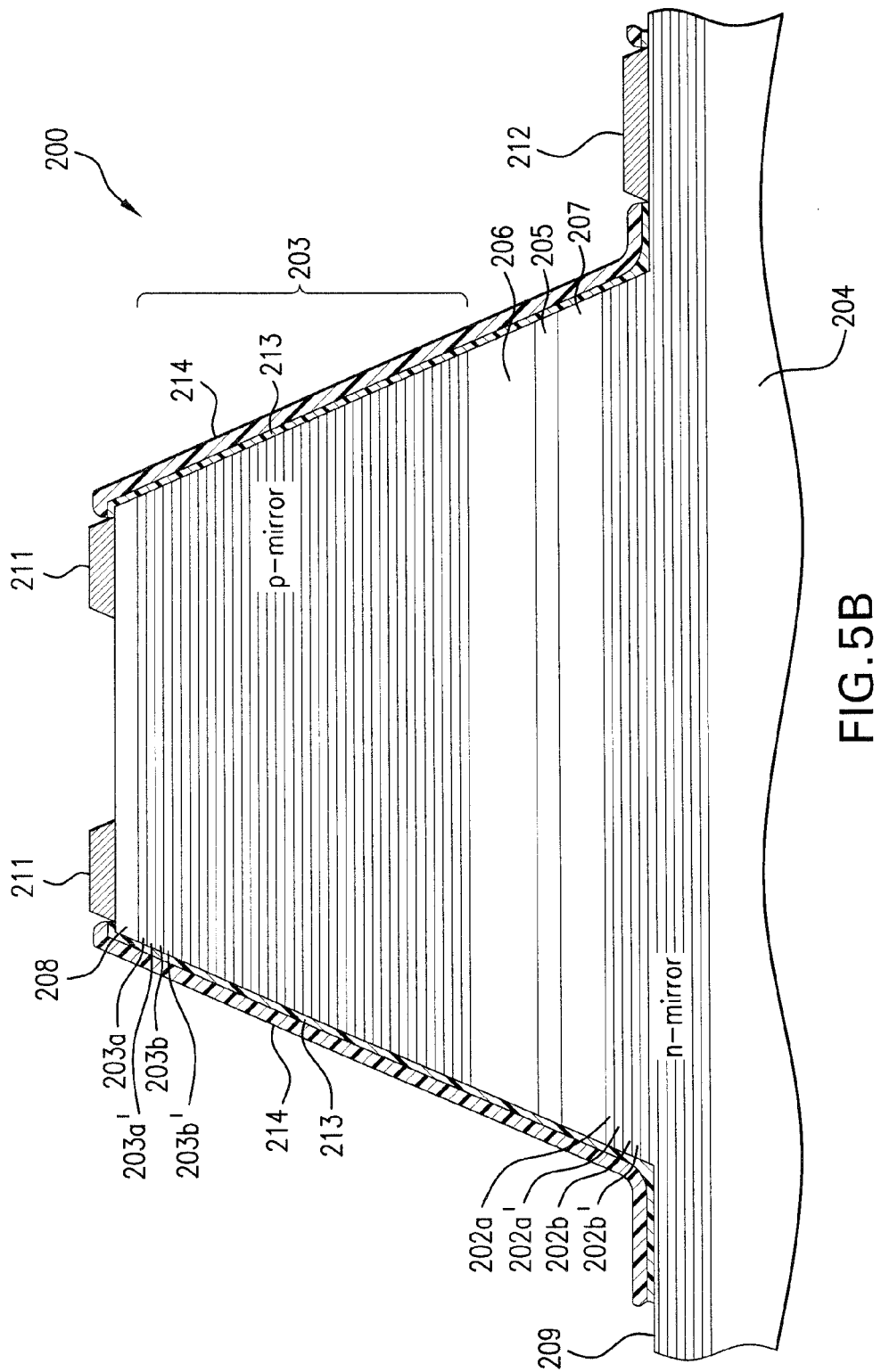
Figure 5C:
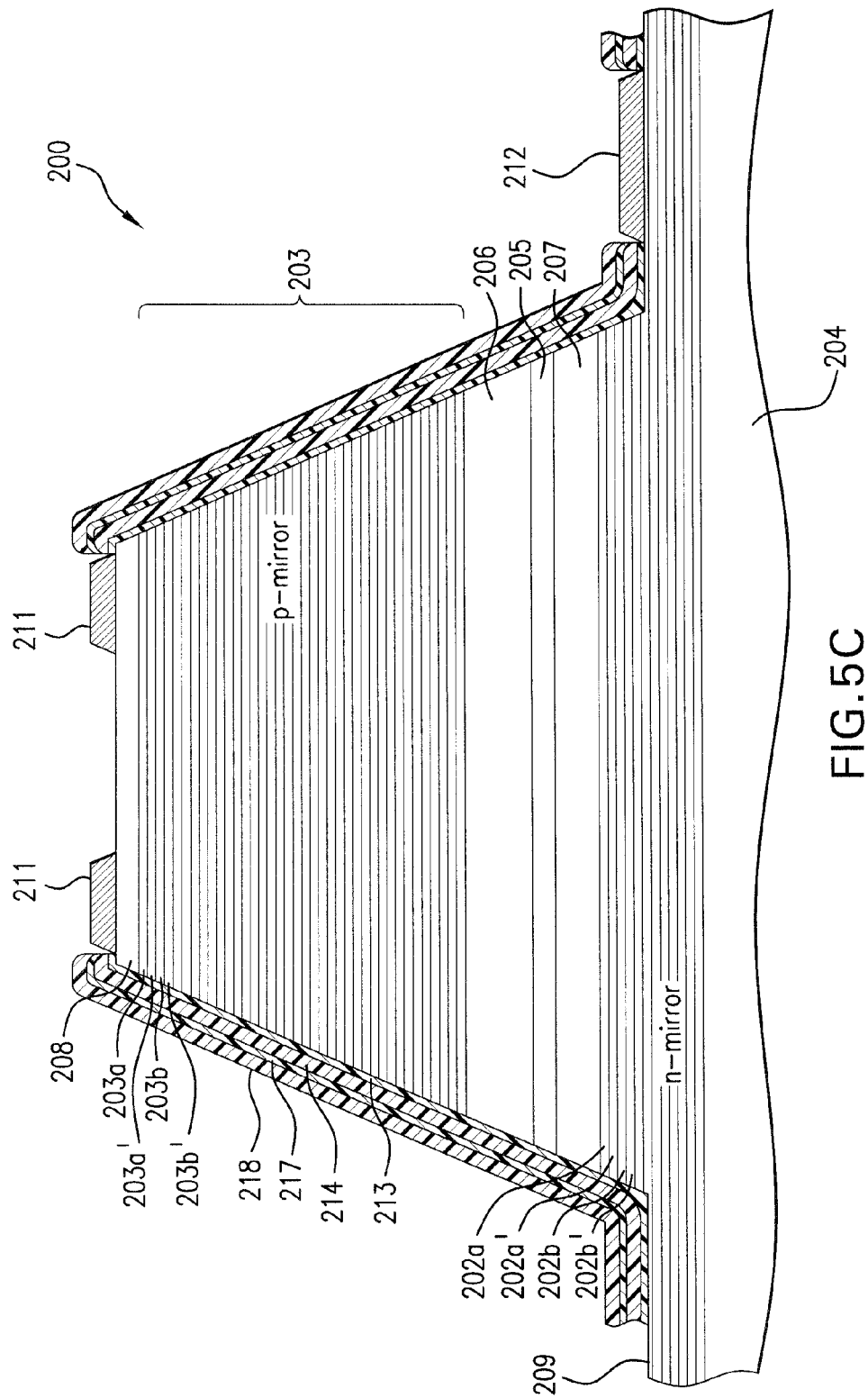

As shown in FIG. 5A, in an embodiment the passivation layer is formed by a layer 213 of SiONx (Oxynitride). Alternatively, the passivation layer may be formed by an alternating sequence of sub-layers of different dielectric materials, with the thicknesses of the dielectric materials selected to minimize the stress applied to the semiconductor structure. In one alternative embodiment, as shown in FIG. 5B, the passivation layer is formed by depositing a layer 213 of SiONx followed by a layer 214 of SiNx (Silicon Nitride). In another alternative embodiment, as shown in FIG. 5C, this sequence may be repeated by depositing a further layer 217 of SiONx and then a further layer 218 of SiNx.

The SiONx layers 213, 217 and the SiNx layers 214, 218 may be deposited by plasma-enhanced chemical vapor deposition. SiONx layers deposited by plasma-enhanced chemical vapor deposition are usually under compressive strain relative to a GaAs semiconductor substrate, whereas SiNx layers deposited by plasma-enhanced chemical vapor deposition are usually under tensile strain relative to a GaAs semiconductor substrate. However, by carefully controlling the thicknesses of the SiONx layers 213, 217 and the SiNx layers 214, 218, the net stress can be controlled to a minimum. Reducing the stress applied by the passivation layer allows deposition of a thicker passivation layer, thereby improving hermeticity. The sloped side walls of the mesa 208 facilitate the deposition of such a thick passivation layer.

Figure 6:
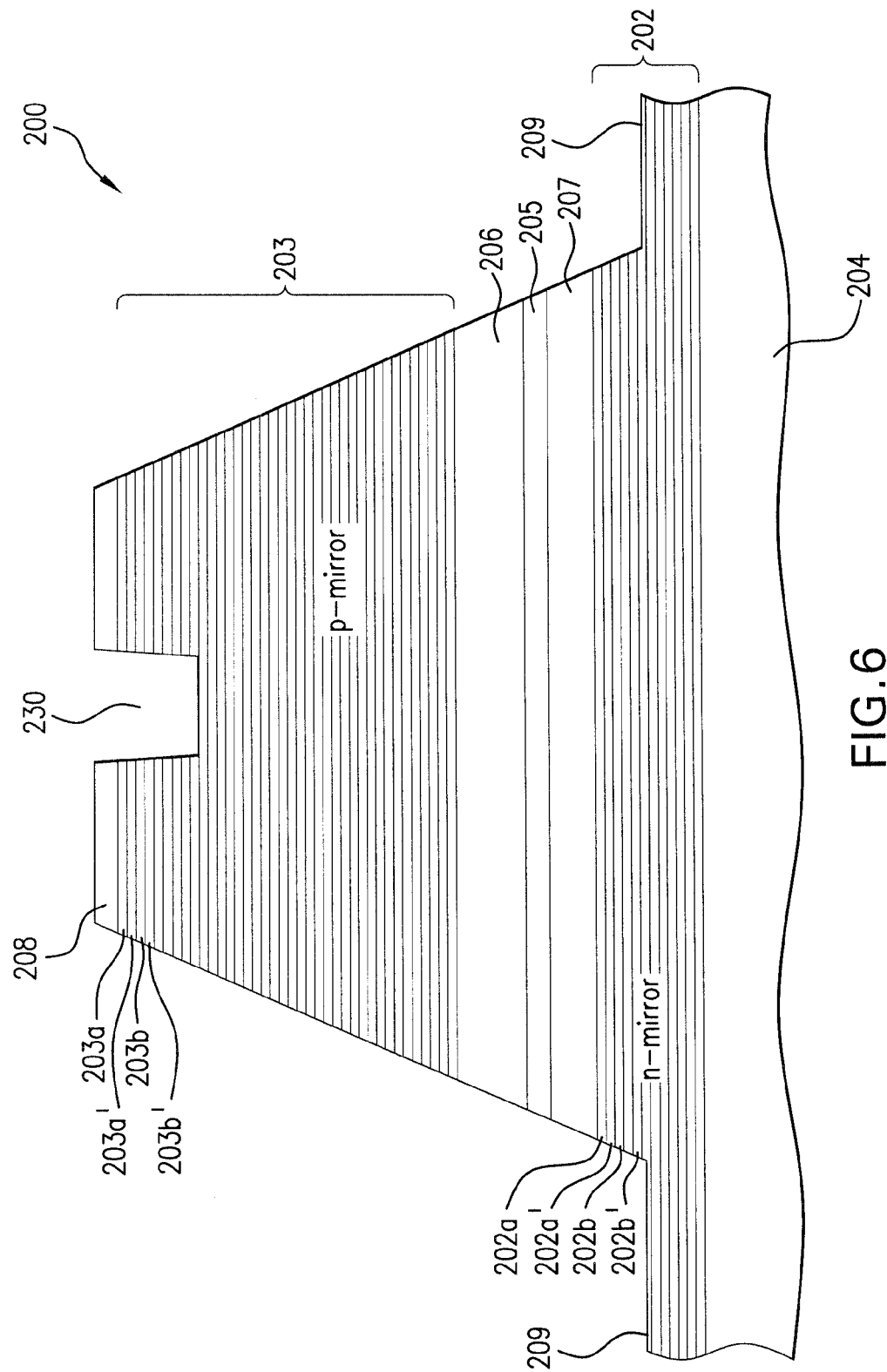
FIG. 6 schematically shows a cross-sectional view of the semiconductor structure illustrated in FIG. 3 after etching the mesa structure to form a recess in the central region in the mesa structure in accordance with a fabrication stage of an alternative embodiment of the invention.

An alternative embodiment of the invention will now be described with reference to FIGS. 6 to 8. In this alternative embodiment, the deposition of the epitaxial semiconductor structure, etching of the epitaxial semiconductor structure to produce a mesa structure, and subsequent oxidation process is substantially the same as previously described with reference to FIGS. 2 to 4. However, as shown in FIG. 6, following oxidation a central cylindrical recess 230 is etched into the generally planar top surface of the mesa 208 in order to quench or suppress some of the transverse optical modes in the manner discussed in US 2007/0217472.

The etching of the central cylindrical recess 230 is preferably performed by dry etching processes, such as BCl3/Cl3/CH$_4$ inductive coupled plasma etching (ICP), reactive ion etching (RIE) or reactive ion beam etching (RIBE). Alternatively, a wet etching process such as etching with a dilute HF with DI water may be used. In this embodiment, the etching extends through most of the second mirror stack 203.

Figure 7:
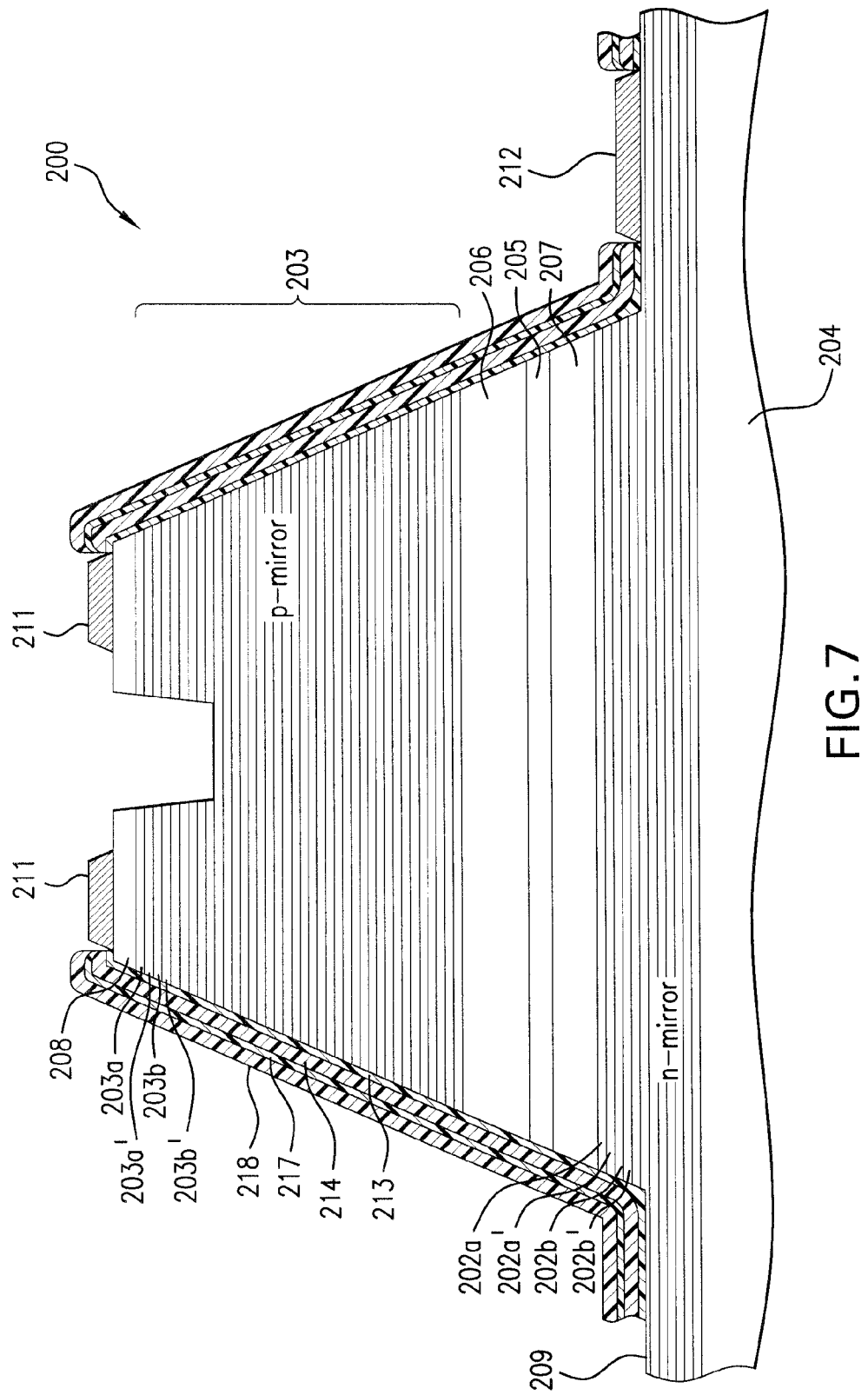
FIG. 7 schematically shows a cross-sectional view of the semiconductor structure of FIG. 6 after deposition of the n and p ohmic contacts and a sequence of passivation layers.
Figure 8:
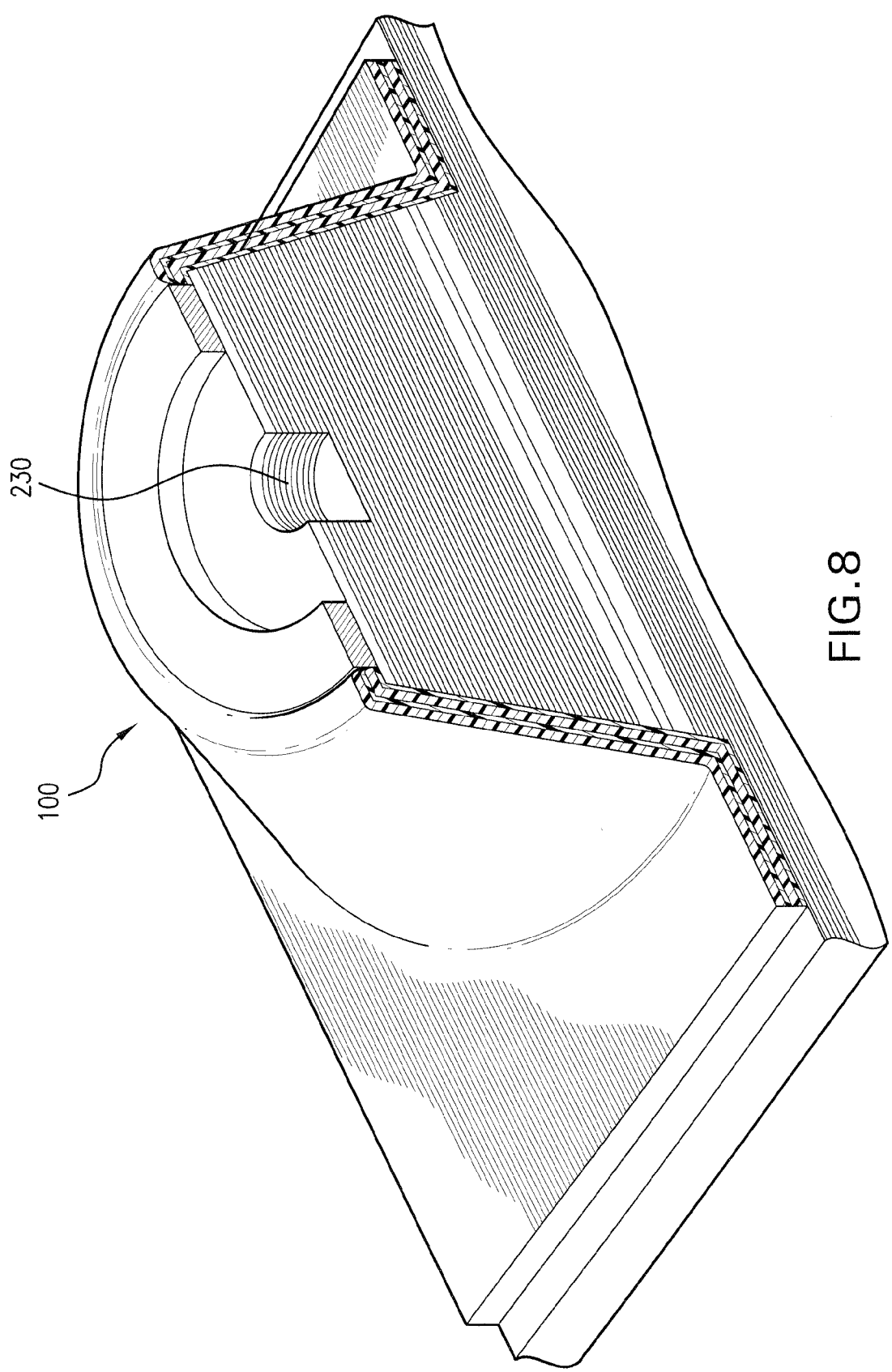
FIG. 8 shows in perspective a cross-sectional detailed view of a semiconductor structure of FIG. 7.

FIG. 7 schematically shows a cross-sectional detailed view of a semiconductor structure after deposition of the p and n ohmic contacts 211, 212 in the structure. The p contact 211 is a substantially annular ring (shown in FIG. 8) that makes ohmic electrical contact with the second mirror stack 203. The n contact 212 is an annular segment that makes ohmic electrical contact with the first mirror stack 202.

FIG. 7 also shows a passivation layer formed over portions of the mesa structure. As previously described with reference to FIGS. 5A to 5C, the passivation layer is formed by alternating sublayers of SiONx (sublayers 213 and 217) and SiNx (sublayers 214 and 218), with the thicknesses of the sublayers being controlled to minimize the stress applied by the passivation layer.

In the alternative embodiment of the present invention, the addition of the central cylindrical recess 230 improves the spectral width characteristic of the VCSEL, although the laser output power is reduced by 5 to 10%.

It will be understood that each of the elements and process steps described above, or two or more together, also may find a useful application in other types of constructions differing from the types described above. For example, the variation in the lateral extent of the oxidized portions of the mirror stacks to reduce internal stress can have application in a mesa structure which does not have sloped sidewalls, for example in a trench structure as shown in FIG. 1B.

While the invention has been illustrated and described as embodied in a semiconductor structure for VCSEL devices, and the process for making such structure, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

We claim:
1. A vertical cavity surface emitting laser comprising:
a substrate;
a plurality of epitaxial layers disposed on the substrate to form an epitaxial stack, wherein at least part of the epitaxial stack is in the form of a mesa structure having sloped side walls; and
a passivation layer at least partly covering said epitaxial stack,
wherein the passivation layer comprises first and second sublayers respectively having first and second stress components associated therewith, the first stress component at least partially countering the second stress component.

2. A vertical cavity surface emitting laser according to claim 1, wherein said sloped side walls are at an angle in the range of ten degrees to thirty degrees from a line perpendicular to a plane of the substrate.

3. A vertical cavity surface emitting laser according to claim 1, wherein the passivation layer further comprises third and fourth sublayers respectively having third and fourth stress components associated therewith, the third stress component at least partially countering the fourth stress component.

4. A vertical cavity surface emitting laser according to claim 3, wherein the first to fourth sublayers comprise an alternating stack of a first material and a second material.

5. A vertical cavity surface emitting laser according to claim 4, wherein the first material comprises silicon oxinitride and the second material comprises silicon nitride.

6. A vertical cavity surface emitting laser according to claim 1 in which the epitaxial stack comprises an active region disposed between a first stack of mirror layers and a second stack of mirror layers, the first stack of mirror layers being between the substrate and the active region,
wherein the epitaxial stack has a central recessed portion extending through at least some of the mirror layers of said second stack.

7. A vertical cavity surface emitting laser comprising:
a substrate;
a plurality of epitaxial layers disposed on the substrate to form an epitaxial stack; and
a passivation layer at least partly covering the epitaxial stack,
wherein the passivation layer comprises first and second sublayers respectively having first and second stress components associated therewith, the first stress component at least partially countering the second stress component, and
wherein the epitaxial stack comprises:
a first stack of mirror layers comprising a semiconductor material doped with a first dopant and having first peripheral oxidized portions extending a first distance into said first stack; and
a second stack of mirror layers comprising a semiconductor material doped with a second dopant and having second peripheral oxidized portions extending a second distance into said second stack,
wherein the first distance is different from the second distance.

8. A vertical cavity surface emitting laser according to claim 7, wherein the first dopant is a donor and the second dopant is an acceptor.

9. A vertical cavity surface emitting laser according to claim 7, wherein the first distance is at least 0.5 μm longer than the second distance.

10. A vertical cavity surface emitting laser according to claim 7, wherein the second peripheral oxidized portions have an aluminum content which differs from the aluminum content of the first peripheral oxidized portions by from 2% to 10%.

11. A vertical cavity surface emitting laser according to claim 7, further comprising a passivation layer comprising first and second sublayers respectively having first and second stress components associated therewith, the first stress component at least partially countering the second stress component.

12. A vertical cavity surface emitting laser according to claim 7, in which said first stack is provided between an active region and the substrate,
wherein the epitaxial stack has a central recessed portion extending through at least some of the mirror layers of said second stack.

\* \* \* \* \*